(12) United States Patent
Simpson et al.

(10) Patent No.: US 10,041,812 B1
(45) Date of Patent: Aug. 7, 2018

(54) MODIFIED EDDY CURRENT PROBE FOR LOW CONDUCTIVITY SURFACES

(71) Applicant: Centrus Energy Corp., Bethesda, MD (US)

(72) Inventors: Marc L. Simpson, Knoxville, TN (US); Michael S. Emery, Powell, TN (US); Caius V. Dodd, Aberdeen, MS (US)

(73) Assignee: Centrus Energy Corp., Bethesda, MD (US)

( * ) Notice: Subject to any disclaimer, the term of this patent is extended or adjusted under 35 U.S.C. 154(b) by 0 days.

(21) Appl. No.: 15/413,504

(22) Filed: Jan. 24, 2017

(51) Int. Cl.
*G01D 5/20* (2006.01)
*H05K 1/16* (2006.01)
*H05K 1/02* (2006.01)

(52) U.S. Cl.
CPC ......... *G01D 5/2006* (2013.01); *H05K 1/0243* (2013.01); *H05K 1/165* (2013.01); *H05K 2201/10151* (2013.01)

(58) Field of Classification Search
CPC ....... G01D 5/2006; H05K 2201/10151; H05K 1/165; H05K 1/0243
USPC .. 324/200, 207.15, 216, 245, 222, 256–258, 324/546, 500, 754.01–754.26, 755.11, 324/756.03, 758.01, 680, 600
See application file for complete search history.

(56) References Cited

U.S. PATENT DOCUMENTS

| | | | | |
|---|---|---|---|---|
| 5,933,329 A | * | 8/1999 | Tijanoc | G09F 9/375 273/236 |
| 2004/0245997 A1 | * | 12/2004 | Plotnikov | G01N 27/904 324/529 |

OTHER PUBLICATIONS

Roach, "Designing and Building an Eddy Current Position Sensor", Sensors Magazine, Sep. 1998, pp. 1-17.

* cited by examiner

*Primary Examiner* — Melissa Koval
*Assistant Examiner* — Trung Nguyen
(74) *Attorney, Agent, or Firm* — MacMillan, Sobanski & Todd, LLC

(57) ABSTRACT

A modified eddy current (MEC) probe includes a probe body having a bore formed therein. A printed circuit board (PCB) assembly includes a circuit board defining a plane, has a plurality of electronic components mounted thereon, and is configured for mounting within the bore of the probe body. A coil board assembly is electrically connected to the PCB assembly and comprises a coil board defining a plane, a transmitter coil formed on a first side of the coil board, and a sensor coil formed on second side of the coil board. The plane of the coil board is arranged orthogonally to the plane of the circuit board.

17 Claims, 7 Drawing Sheets

MODIFIED EDDY CURRENT PROBE FOR LOW CONDUCTIVITY SURFACES

GOVERNMENT LICENSE RIGHTS

This invention was made with government support under contract numbers ORNL00-0579 and 4000130255 awarded by Oak Ridge National Laboratory. The government has certain rights in the invention.

BACKGROUND OF THE INVENTION

This invention relates to an eddy current probe configured to measure a distance between the eddy current probe and a surface of an object spaced apart from the eddy current probe. In particular, this invention relates to an improved or modified eddy current probe (MEC) that can accurately measure the distance between the probe and a surface of an object formed from a low conductivity material.

Known eddy current probes are configured to monitor and analyze rotating and reciprocating machinery and measure the distance between an eddy current probe and a surface of an object. Typically, an eddy current probe is positioned near a monitored target object, such as a rotating shaft of a machine or an outer race of a rolling element bearing. Known eddy current probes are designed to monitor and/or measure the distance to the surface of high conductivity materials such as metals. Further, known eddy current probes operate at frequencies within the range of about 500 KHz to about 1 MHz.

Carbon fiber composite materials, such as graphite are used in a variety of structures, including carbon brushes for motors, seals and bearings, vane pump components, assemblies for fuel pumps, starters, and alternators, and bi-polar plated for fuel cells. Additionally, graphite structures are used in rotating devices wherein higher bandwidths and sub-mil resolution are required. There is therefore a need in many industries to measure the distance to the surfaces of graphite structures and to locate cracks or defects in the surfaces of graphite structures. Industries with such a need include the power, aircraft, automotive, turbine, mass transit, and railway industries.

Known sensor technology, including eddy current sensors, capacitive sensors, magnetic sensors, and acoustic sensors, are not able to measure the distance to low conductivity materials, such as graphite. Further, these known sensors are not able to monitor and analyze, such as for inspection and balancing, rotating components formed from low conductivity materials, such as graphite.

Thus, it would be desirable to provide an improved structure for an eddy current probe that can accurately monitor, analyze, and measure the distance between the probe and a surface of an object formed from a low conductivity material such as graphite.

SUMMARY OF THE INVENTION

This invention relates to an improved or modified eddy current probe (MEC) that can accurately monitor, analyze, and measure the distance between the probe and a surface of an object formed from a low conductivity material such as graphite.

The MEC probe includes a probe body having a bore formed therein. A printed circuit board (PCB) assembly includes a circuit board defining a plane, has a plurality of electronic components mounted thereon, and is configured for mounting within the bore of the probe body. A coil board assembly is electrically connected to the PCB assembly and comprises a coil board defining a plane, a transmitter coil formed on a first side of the coil board, and a sensor coil formed on second side of the coil board. The plane of the coil board is arranged orthogonally to the plane of the circuit board.

Various aspects of this invention will become apparent to those skilled in the art from the following detailed description of the preferred embodiment, when read in light of the accompanying drawings.

DETAILED DESCRIPTION OF THE PREFERRED EMBODIMENT

Figure 1:
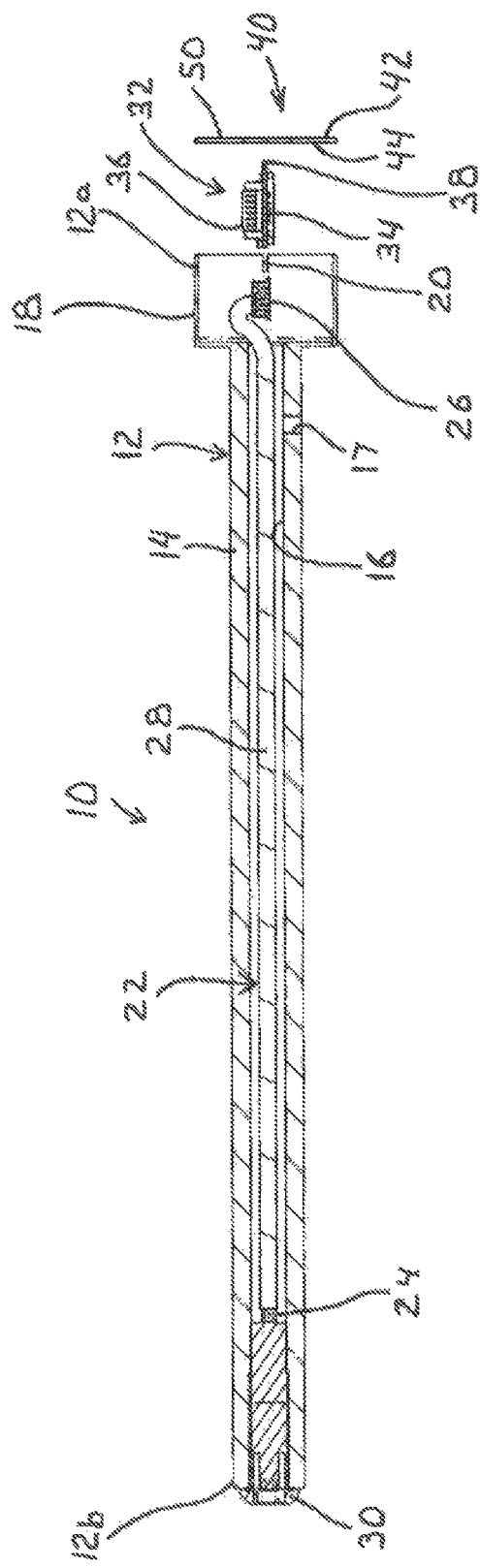
FIG. 1 is a partially exploded cross-sectional view of a modified eddy current (MEC) probe in accordance with this invention.

Referring now to the drawings, there is illustrated in FIG. 1 the structure of an improved or modified eddy current (MEC) probe 10 in accordance with this invention. The MEC probe 10 includes a probe body 12 having a first end 12a and a second end 12b. The probe body 12 has an elongated, substantially cylindrical stem 14 defining a longitudinally extending bore 16 formed therein. A hole 17, the purpose for which is described below, may be formed in the stem 14. The second end of the probe body 12 defines a cup 18. Longitudinally extending notches 20 are formed in a wall of the cup 18. The probe body 12 may be formed from brass. Alternatively, the probe body 12 may be formed from other metals, such as copper, metal alloys, and other conductive material.

In the illustrated embodiment, the stem 14 has an outside diameter of about 0.625 inches. Alternatively, the stem 14 may have any other desired diameter, such as a diameter within the range of about 0.50 inches to about 0.75 inches. In the illustrated embodiment, the cup 18 has an outside diameter of about 1.250 inches. Alternatively, the cup 18 may have any other desired diameter, such as a diameter within the range of about 1.125 inches to about 1.375 inches. The probe body 12 may have a length of about 10.715 inches. Alternatively, the probe body 12 may have any other desired length that may be determined based on the application in which the MEC probe 10 will be used.

A wiring assembly 22 is mounted within the bore 16 of the stem 14. The wiring assembly 22 includes wiring cable 24, such as a flat ribbon cable. A first end of the wiring assembly 22 includes a connector 26 disposed within the cup 18 and configured for connection to a MEC printed circuit board (PCB) assembly 32, described below. A cable shield 28 surrounds the wiring cable 24, and a connector 30 is attached to a second end of the wiring assembly 22. The connector 30 is configured for attachment within the bore 16 at the open second end 12b of the probe body 12, such as with a threaded connection, and further configured for attachment to a source of electrical power (not shown). The connector may be further sealed within the bore 16 with an adhesive, such as Torr Seal® epoxy resin.

Figure 2A:
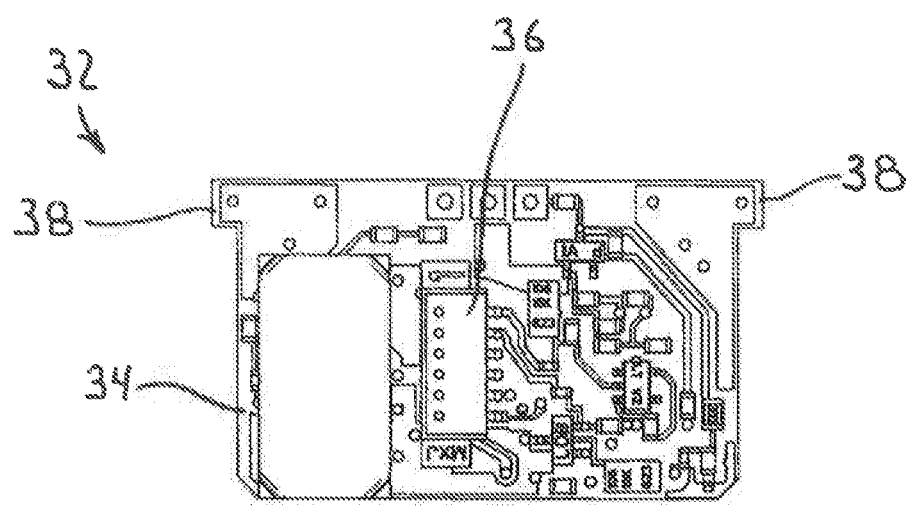
FIG. 2A is a plan view of the MEC printed circuit board (PCB) assembly illustrated in FIG. 1.
Figure 2B:
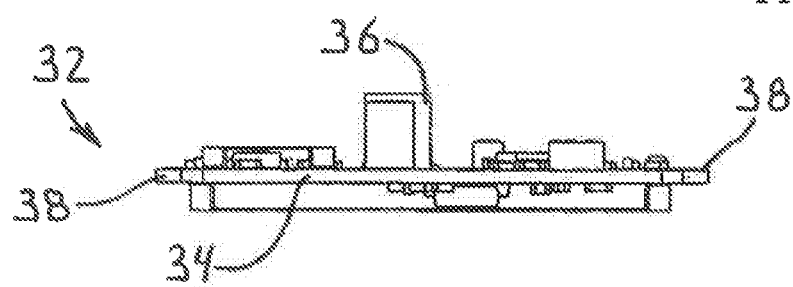
FIG. 2B is a side view of the MEC PCB assembly illustrated n FIGS. 1 and 2A.
Figure 4:
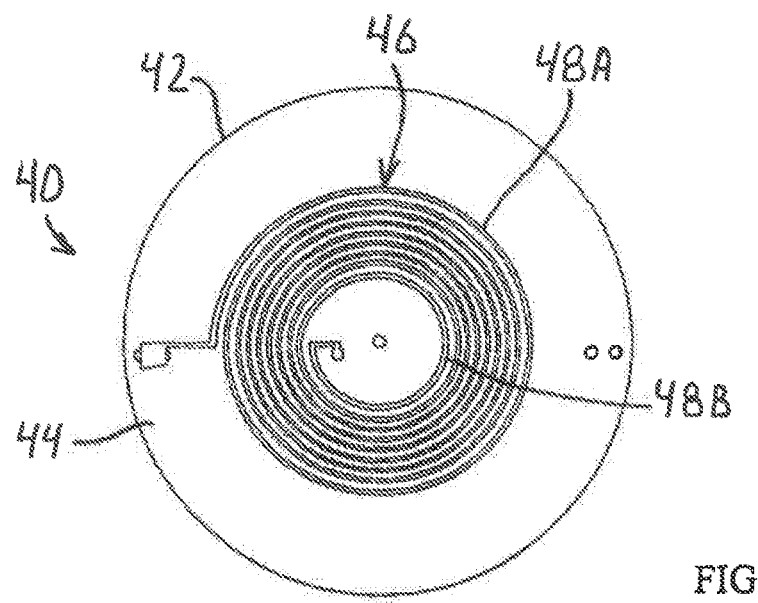
FIG. 4 is a plan view of an inside surface of the coil board assembly illustrated in FIG. 1 showing the transmitter coil.
Figure 3:
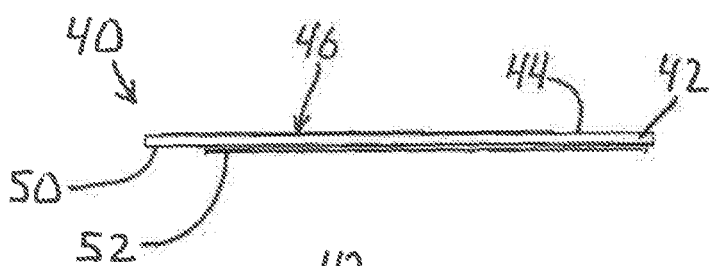
FIG. 3 is an enlarged side view of the coil board assembly illustrated in FIG. 1.
Figure 5:
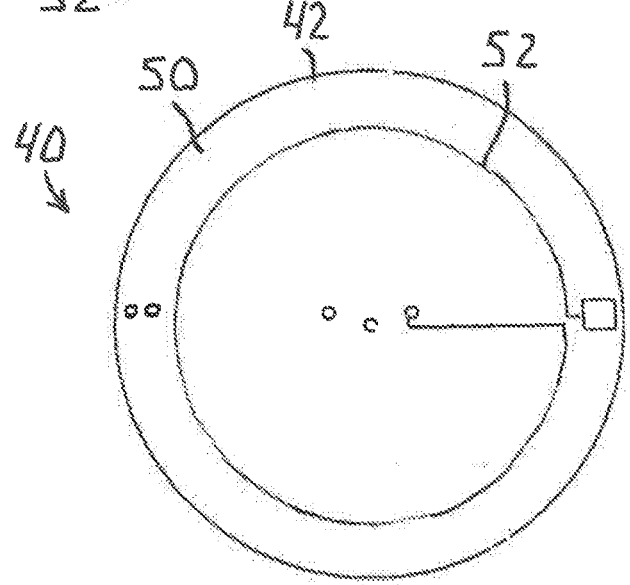
FIG. 5 is a plan view of an outside surface of the coil board assembly illustrated in FIG. 1 showing the sensor coil.

The MEC PCB assembly 32, also shown in FIGS. 2A and 2B, includes a conventional circuit board 34 configured to have mounted thereon electronic components, such as capacitors, resistors, voltage regulators, and the like. A connector 36, such as a six pin connector (see FIGS. 1, 2A, and 6D), is mounted to the circuit board 34 and is configured for attachment to the connector 26 of the wiring assembly 22. The circuit board 34 is substantially rectangular in shape, defines a large ground plane, and includes outwardly extending tabs or flanges 38 configured for mounting within the notches 20.

A conventional eddy current probe typically includes: (1) one or more coils which provide an electro-magnetic field that induces eddy currents in a surface, (2) an oscillator configured to drive the one or more coils with a sine wave at a desired frequency that is determined by the application, (3) a sensing circuit to sense changes in the coupling between the one or more coils and the induced eddy currents in the surface, and (4) an electronic interface that processes the output of the sensed circuit and transmits the output information to a processor.

The MEC probe 10 described herein improves upon conventional eddy current probes, provides a compact, inexpensive package, and includes a coil board assembly 40, shown in FIGS. 1 and 3 through 5. The coil board assembly 40 includes a substantially circular coil board 42, formed from conventional circuit board material, such as FR4. Alternatively, the coil board 42 may be formed from any glass-reinforced epoxy laminate or other desired material. The coil board 42 has a size and shape corresponding to the opening of the cup 18, and is configured to be attached within the cup 18 at the open first end 12a of the probe body 12, and is also configured for electrical connection to the MEC PCB assembly 32. Further, electric grounds (not shown) on the MEC PCB assembly 32 and on the coil board assembly 40 may be soldered to the wall of the cup 18 to minimize stray capacitance. These solder joints also serve as connection joints to attach the MEC PCB assembly 32 and the coil board assembly 40 to the cup 18.

In the illustrated embodiment, the coil board 42 has an outside diameter of about 1.250 inches. Alternatively, the coil board 42 may have any other desired diameter, such as a diameter within the range of about 1.125 inches to about 1.375 inches.

A first or inside surface 44 of the coil board 42 includes a transmitter coil 46 formed thereon by any desired method, such as conventional PCB manufacturing methods. The transmitter coil 46 includes nine loops and the terminal ends thereof are attached to the coil board 42 such as with solder. Alternatively, the transmitter coil 46 may have other desired numbers of loops, including less than nine loops and more than nine loops.

An outer loop 48A of the transmitter coil 46 may have a diameter of about 0.75 inches, and an inner loop 48B of the transmitter coil 46 may have a diameter of about 0.43 inches. Alternatively, the outer loop 48A and the inner loop 48B may have any other desired diameters that may be determined based on the application in which the MEC probe 10 will be used and the desired transmitter frequency.

A second or outside surface 50 of the coil board 42 includes a sensor coil 52 formed thereon. Like the transmitter coil 46, the sensor coil 52 may be formed on the surface 50 by any desired method, such as conventional PCB manufacturing methods. The sensor coil 52 includes a single loop having a diameter of about 1.0 inch and the terminal ends thereof are attached to the coil board 42 such as with solder. Alternatively, the sensor coil 52 may have other diameters determined by the size of the coil board 42 and the size of the transmitter coil 46.

Significantly, conventional eddy current probes typically do not include a separate sensor coil, but instead monitor an output of the oscillator tank circuit directly. Advantageously, the sensor coil 52 functions as a very high Q filter of the fields induced in the surface of the low conductivity material of the target, and therefore provides sine waves with small harmonics that reduces error in subsequent signal processing.

Figure 6A:
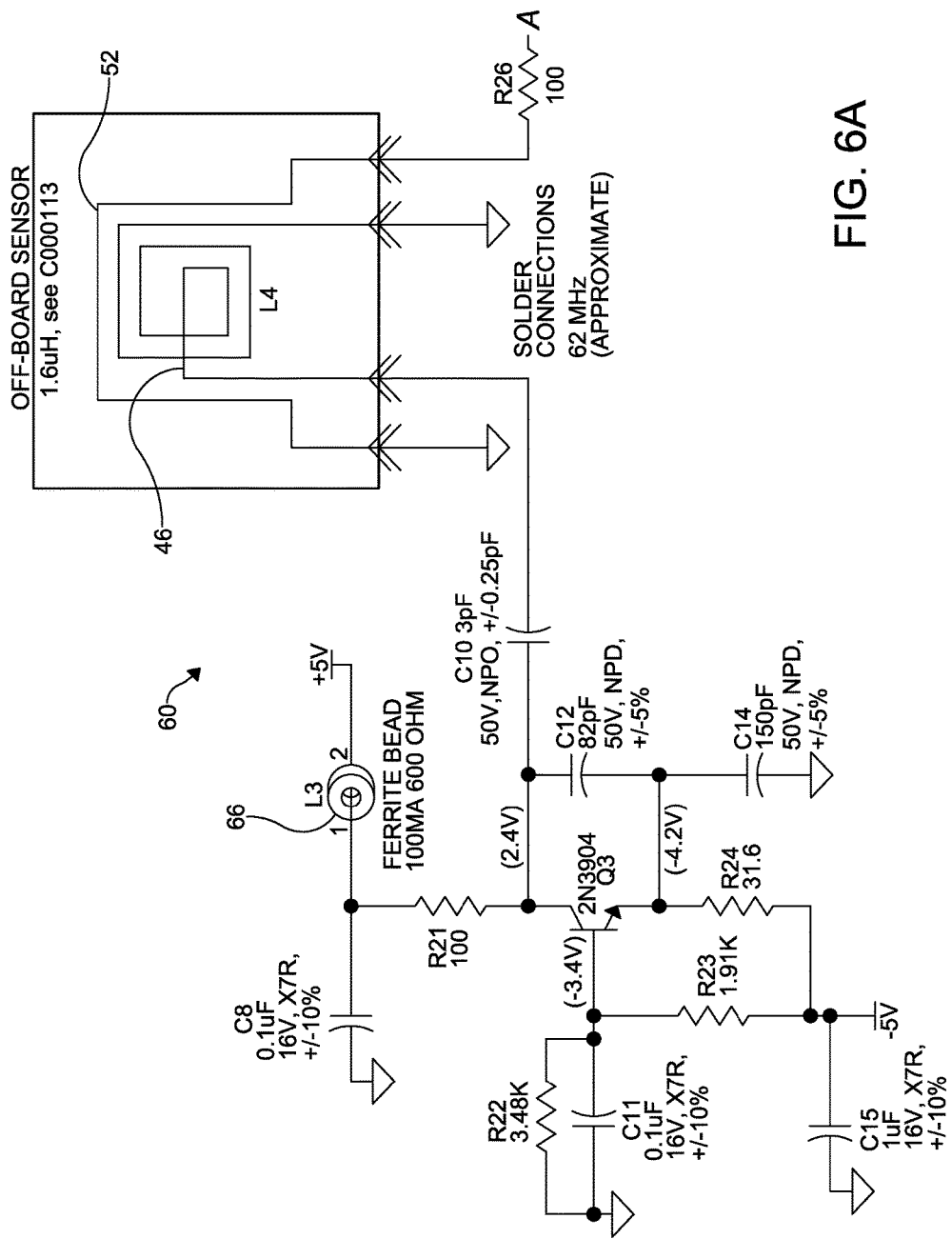
FIGS. 6A, 6B, 6C, and 6D are a circuit diagram for the MEC probe illustrated in FIG. 1.
Figure 6B:
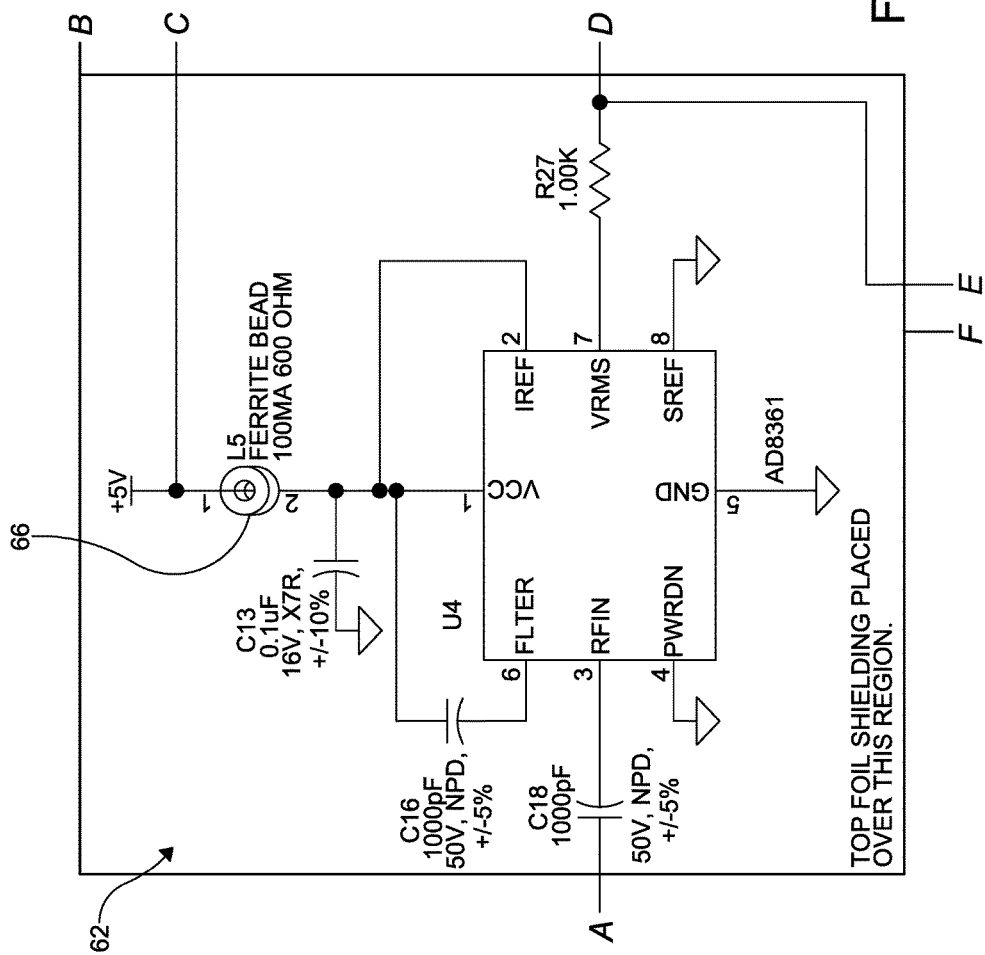
Figure 6C:
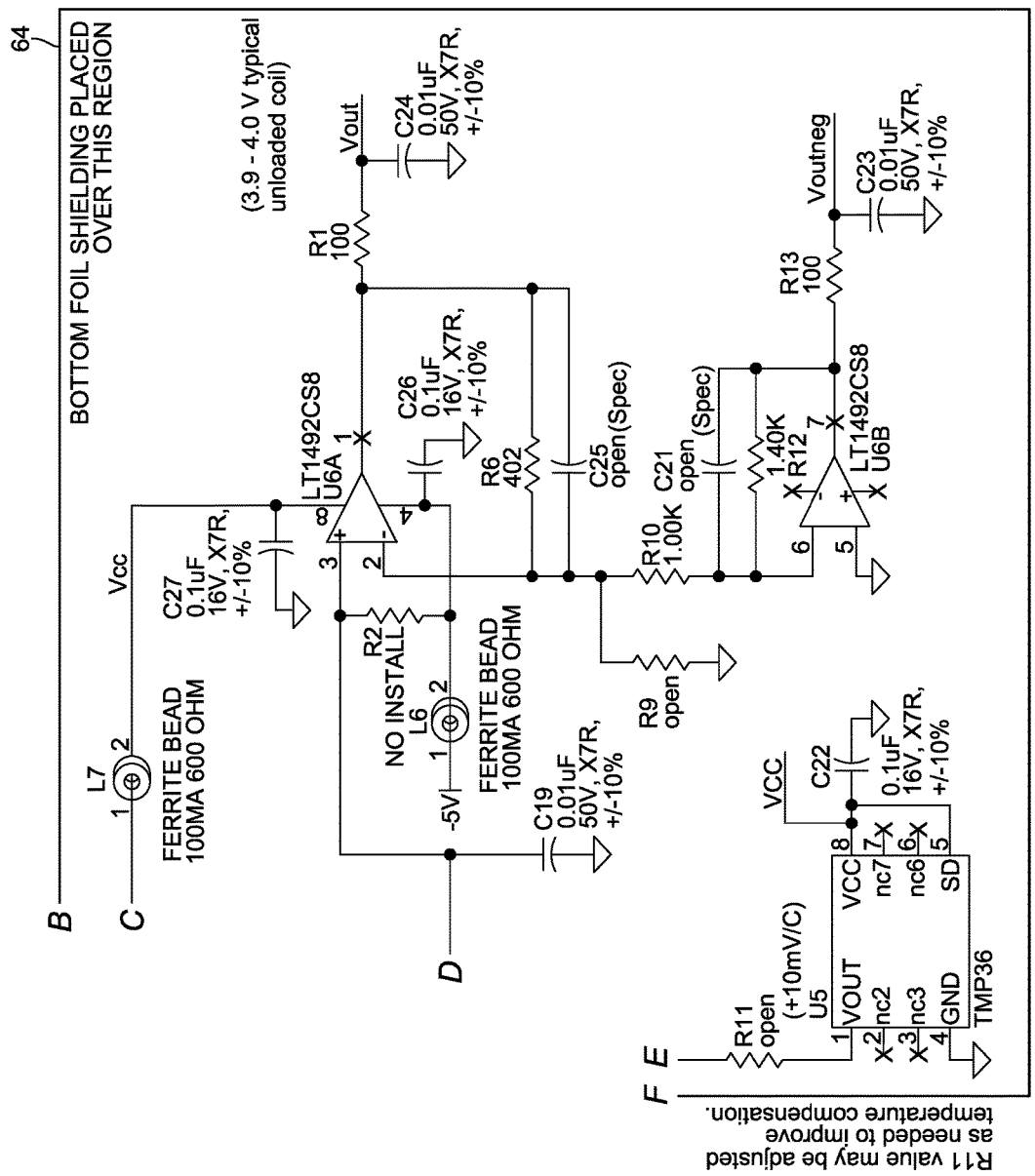
Figure 6D:
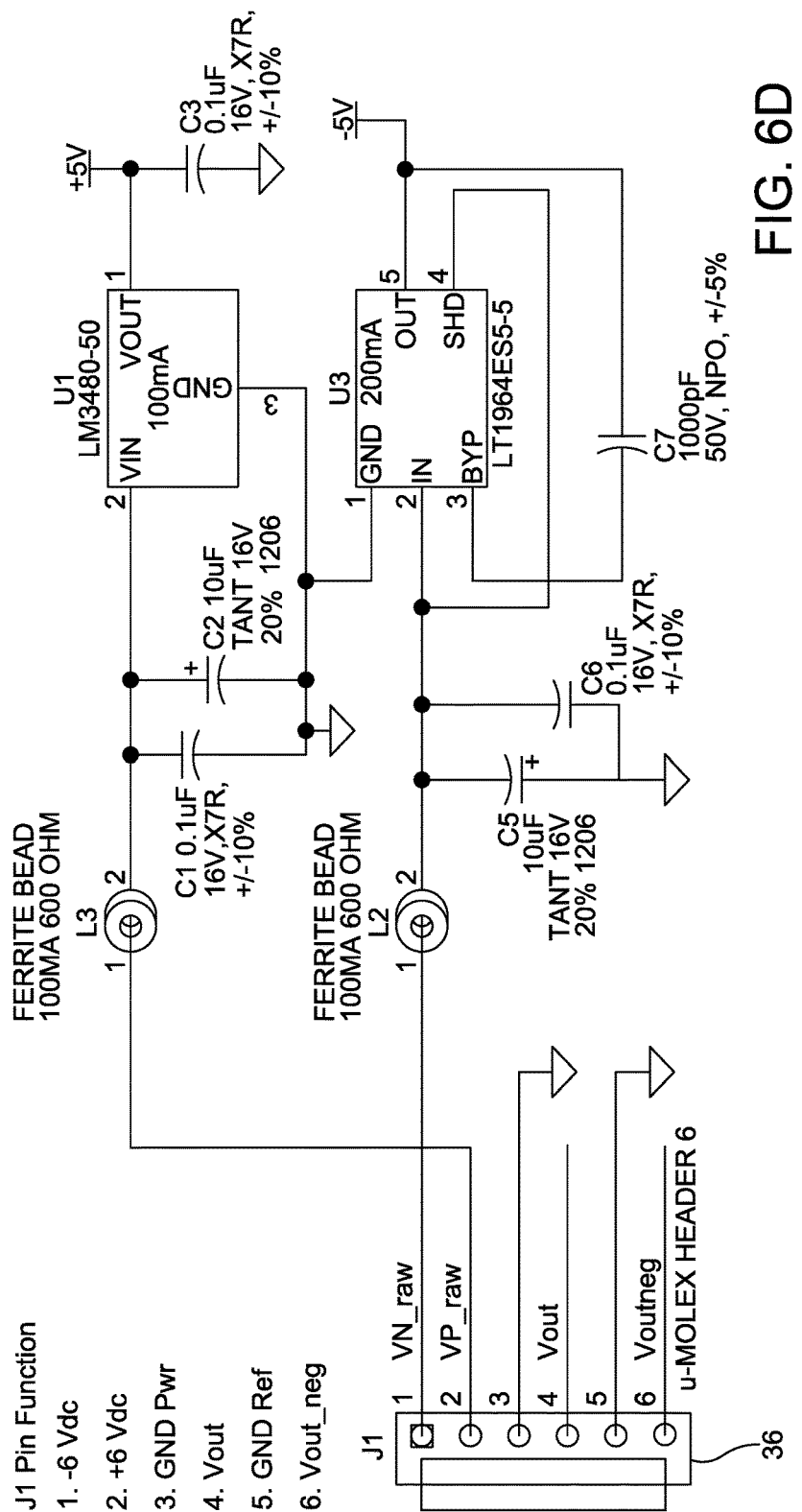

The MEC PCB assembly 32 includes an oscillator circuit 60 that drives the transmitter coil 46 (see the circuit diagram of the MEC probe 10 shown in FIGS. 6A-6D). It has been discovered that it is possible to induce surface eddy currents in low conductivity materials, such as graphite by using a high frequency radio frequency (RF) sine wave. The magnitude power dissipation of the surface eddy currents is proportional to the volume resistivity of the low conductivity material and a distance between the surface and the transmitter coil 46. As shown in FIG. 6A, a sine wave having a frequency of about 62 MHz may be used. Alternatively, a sine wave having a frequency greater than about 10 MHz, and preferably greater than about 50 MHz, may be used. This frequency is significantly higher than the about 500 KHz to about 1 MHz frequency range at which known eddy current probes operate, as described above.

The oscillator circuit 60 used to generate the about 62 MHz sine wave may be a conventional Clapp oscillator circuit having a single bipolar transistor and passive biasing. In this arrangement, the oscillation frequency may be largely determined by a tank circuit that includes the transmitter coil (L4 in FIG. 6A) and a capacitor C10. The target material, i.e., the graphite or other low conductivity material, may resistively load the tank circuit resulting in decreasing oscillation amplitude as a distance to the target decreases.

The MEC probe 10 further includes improved interface electronics. As shown generally at 62 in FIG. 6B, a signal from the sensor coil (L4 in FIG. 6A) may drive U4, an analog device, such as an AD8361, and a true root mean square (RMS) high frequency integrated circuit. The output of U4 is a DC voltage proportional to the RMS value of the RF signal input. Additional low-pass filtering may be provided by R27 and c19 to limit the output bandwidth to about 15.9 kHz. The output may be buffered by U6, such as a Linear Technology LT1492 operational amplifier (op-amp), and provides a differential output.

The improved interface electronics also includes supporting voltage supplies and noise minimization components. The input DC supply voltages are heavily filtered, and may be regulated on the MEC PCB assembly 32 by low dropout voltage regulator chips U1 and U3, such as a National Semiconductor LM3480-5.0 and a Linear Technology LT1964ES5-5, respectively. The LM3480 is a positive regulator that requires a minimum of 0.8 V headroom to maintain regulation. The LT1964 is a negative regulator that requires less than 0.3 V headroom to maintain regulation. In the MEC probe 10 described herein, an optimal supply voltage has been determined to be 6.2 V in order to allow for voltage drop along the cable and still provide a comfortable margin of headroom at the MEC PCB assembly 32.

The packaging and relative positions of the components of the MEC probe 10 (see FIG. 1) have been shown to be key to the successful operation of the MEC probe 10. Because the frequency of the transmitter coil 46 is above about 50 MHz (in the embodiment described above, the transmitter coil 46 operates at about 62 MHz), the transmitter coil 46, the sensor coil 52 and the various electronic components mounted on the MEC PCB assembly 32 must be positioned in close proximity to each other to minimize undesirable stray capacitance and to reduce undesirable noise.

As shown in FIG. 1, the MEC PCB assembly 32 is oriented substantially orthogonally to the transmitter coil 46 and the sensor coil 52 formed on the coil board 42. This orthogonal orientation reduces unwanted coupling of electromagnetic fields from the transmitter coil 46 to the various electronic components of the MEC PCB assembly 32. Alternatively, the MEC PCB assembly 32 may be oriented at other angles relative to the transmitter coil 46 and the sensor coil 52 formed on the coil board 42, such as within the range of about 90 degrees+/−about 10 degrees. Additionally, the MEC PCB assembly 32 may be oriented at other desired angles relative to the transmitter coil 46 and the sensor coil 52 formed on the coil board 42. Additionally, the multi-loop transmitter coil 46 and the single-loop sensor coil 52 on the respective inside surface 44 and outside surface 50 of the coil board 42 reduce pick-up signal distortions and increases accuracy in the RMS signal processing step.

As shown, the MEC PCB assembly 32 is electrically connected to the inside surface 44 of the coil board 42. Contacts (not shown) on the transmitter coil 46 may be electrically connected to contacts (not shown) on the MEC PCB assembly 32, such as with solder, using very short leads, such as $1/10$ of a wavelength or less.

Additionally, because the electro-magnetic field is largest in a center of the transmitter coil 46, the various electronic components of the MEC PCB assembly 32 may be arranged such that a distance from the center of the transmitter coil 46 to the most electronically sensitive components on the MEC PCB assembly 32 is maximized.

To further assist in noise reduction, a copper shield, schematically illustrated in FIGS. 6B and 6C, may be placed over any desired components of the MEC PCB assembly 32 that are determined to be RF sensitive. In addition to the low drop-out voltage regulator chips U1 and U3, ferrite beads 66 (see FIGS. 6A-6D) may be provided on any electrical line or cable to isolate the power sources.

In applications wherein the MEC probe 10 is mounted for operation in a vacuum, the hole 17 in the stem 14 allows pressure to equalize across the transmitter coil 46.

Advantageously, the MEC probe 10 is configured to operate at RF frequencies above about 10 MHz to measure a distance to a the surface of an object formed from a low conductivity material, such as graphite with less than 0.1 mil sensitivity over a range of 400 mils with bandwidths greater than about 10 KHz.

Additionally, the single loop sensor coil and multiple loop transmitter coil formed on the respective outside and inside surfaces of the coil board assembly 40 reduce pick-up signal distortion and increase accuracy in the RMS conversion processing step (see 62 in FIG. 6B) in a compact and inexpensive package.

Further, the features of the improved MEC probe 10, including: the ability to successfully operate at RF frequencies above about 50 MHz, the MEC PCB assembly 32 being oriented orthogonally to the transmitter coil 46 and the sensor coil 52 formed on the coil board assembly 40, the sensor coil 52 being formed on an outside surface 50 of the coil board assembly 40, the short lead connections between the transmitter coil 46 and the MEC PCB assembly 32, the most electronically sensitive components on the MEC PCB assembly 32 being positioned a maximum distance from the center of the transmitter coil 46, the ferrite beads on the power lines, the isolated power sources, the copper shields on RF sensitive components, and the large ground planes on the MEC PCB assembly 32.

The principle and mode of operation of this invention have been explained and illustrated in its preferred embodiment. However, it must be understood that this invention may be practiced otherwise than as specifically explained and illustrated without departing from its spirit or scope.

What is claimed is:

1. A modified eddy current (MEC) probe comprising:
   a probe body having an elongated cylindrical stem defining a longitudinally extending bore formed therein;
   a printed circuit board (PCB) assembly including a circuit board defining a plane and having a plurality of electronic components mounted thereon, the PCB assembly configured for mounting within the bore of the probe body; and
   a coil board assembly electrically connected to the PCB assembly, the coil board assembly comprising:
      a coil board defining a plane and having a first planar surface and a second planar surface opposite the first planar surface;
      a transmitter coil having a plurality of loops configured in a spiral pattern and formed on the first planar surface of the coil board; and
      a sensor coil having a single loop formed on the second planar surface of the coil board;
   wherein the plane of the coil board and the transmitter and sensor coils formed thereon is arranged orthogonally to the plane of the circuit board.

2. The MEC probe according to claim 1, wherein the coil board assembly is mounted within the bore of a distal end of the probe body.

3. The MEC probe according to claim 1, wherein the transmitter coil operates at a frequency greater than about 10 MHz.

4. The MEC probe according to claim 1, wherein the transmitter coil operates at a frequency greater than about 50 MHz.

5. The MEC probe according to claim 1, wherein the transmitter coil operates at a frequency of about 62 MHz.

6. The MEC probe according to claim 1, wherein the transmitter coil generates an electro-magnetic signal configured to measure a distance to a surface of an object formed from a material having low conductivity.

7. The MEC probe according to claim 1, wherein the transmitter coil generates an electro-magnetic signal configured to measure a distance to a surface of an object formed from graphite.

8. The MEC probe according to claim 1, wherein the transmitter coil operates at a frequency greater than about 10 MHz and measures a distance to the surface of the object formed from a material having low conductivity with less than about 0.1 mil sensitivity over a range of about 400 mils.

9. The MEC probe according to claim 1, wherein the transmitter coil operates at a frequency greater than about 10 MHz and measures a distance to the surface of the object formed from graphite with less than about 0.1 mil sensitivity over a range of about 400 mils.

10. The MEC probe according to claim 1, wherein the transmitter coil is a nine-loop coil.

11. The MEC probe according to claim 1, wherein contacts on the transmitter coil are electrically connected to contacts on the PCB assembly with leads of 1/10 of a wavelength or less.

12. The MEC probe according to claim 1, further including ferrite beads on at least one electrical line, the ferrite beads configured to isolate power sources within the MEC probe.

13. The MEC probe according to claim 1, further including a copper shield positioned over at least one RF sensitive electrical component of the PCB assembly.

14. The MEC probe according to claim 1, further including low dropout voltage regulator chips on the PCB assembly configured to regulate input DC supply voltages.

15. A modified eddy current (MEC) probe comprising:
   a probe body having an elongated cylindrical stem defining a longitudinally extending bore formed therein;
   a printed circuit board (PCB) assembly including a circuit board defining a plane and having a plurality of electronic components mounted thereon, the PCB assembly configured for mounting within the bore of the probe body; and
   a coil board assembly electrically connected to the PCB assembly, the coil board assembly comprising:
      a coil board defining a plane and having a first planar surface and a second planar surface opposite the first planar surface;
      a multi-loop transmitter coil configured in a spiral pattern and formed on the first planar surface of the coil board; and
      a single-loop sensor coil formed on the second planar surface of the coil board;
   wherein the plane of the coil board and the transmitter and sensor coils formed thereon is arranged orthogonally to the plane of the circuit board, and
   wherein the transmitter coil operates at a frequency greater than about 10 MHz and measures a distance to the surface of the object formed from a material having low conductivity with less than about 0.1 mil sensitivity over a range of about 400 mils.

16. The MEC probe according to claim 15, wherein contacts on the transmitter coil are electrically connected to contacts on the PCB assembly with leads of 1/10 of a wavelength or less.

17. The MEC probe according to claim 16, further including:
   ferrite beads on at least one electrical line, the ferrite beads configured to isolate power sources within the MEC probe; and
   a copper shield positioned over at least one RF sensitive electrical component of the PCB assembly.

* * * * *